(12) United States Patent
Kuroiwa

(10) Patent No.: US 7,507,945 B2
(45) Date of Patent: Mar. 24, 2009

(54) SOLID STATE IMAGING DEVICE INCLUDING A MICROLENS-FORMING LAYER

(75) Inventor: Karin Kuroiwa, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 64 days.

(21) Appl. No.: 11/645,651

(22) Filed: Dec. 27, 2006

(65) Prior Publication Data
US 2007/0146513 A1 Jun. 28, 2007

(30) Foreign Application Priority Data
Dec. 27, 2005 (JP) ............... 2005-374887

(51) Int. Cl.
*H01L 27/00* (2006.01)
(52) U.S. Cl. .............. 250/208.1; 250/214.1; 250/216; 257/432
(58) Field of Classification Search .......... 250/208.1, 250/216; 438/65; 348/307–310; 257/291, 257/292
See application file for complete search history.

(56) References Cited

U.S. PATENT DOCUMENTS 5,371,397 A * 12/1994 Maegawa et al. ........... 257/432

6,252,219 B1 6/2001 Abe et al.
6,259,083 B1 7/2001 Kimura et al.
7,250,973 B2 * 7/2007 Dobashi et al. ............. 348/340

FOREIGN PATENT DOCUMENTS

JP 2558389 B2 9/1996

* cited by examiner

*Primary Examiner*—Georgia Y Epps
*Assistant Examiner*—Tony Ko
(74) *Attorney, Agent, or Firm*—Birch, Stewart, Kolasch & Birch, LLP

(57) ABSTRACT

A solid state imaging device has a semiconductor substrate with photodiodes formed thereon. Stacked on the semiconductor substrate are a light shielding layer having openings for the photodiodes, a concave microlens-forming layer having concave lens surfaces on its upper surface, a planarizing layer for covering the concave microlens-forming layer, a color filter, and a convex microlens-forming layer having convex lens surfaces on its upper surface. Each concave lens surface is composed of an arc-shaped incident surface lying at the lowermost part and a reflecting surface extending upwards from a rim of the incident surface. The light rays out of the concave lens surface enter either the incident surface or the reflecting surface of the concave lens surface. The light rays on the reflecting surface reflect off totally and proceed to the incident surface. The light rays on the incident surface are focused toward the photodiode.

20 Claims, 7 Drawing Sheets

SOLID STATE IMAGING DEVICE INCLUDING A MICROLENS-FORMING LAYER

FIELD OF THE INVENTION

The present invention relates to a solid state imaging device, such as a CCD image sensor.

BACKGROUND OF THE INVENTION

Digital cameras are widely used which convert images captured by a solid state imaging device, such as CCD, into digital image data and store the data in recording media such as an internal memory and a memory card. The solid state imaging device in such digital cameras includes a semiconductor substrate on which light receiving elements (photodiodes) are arranged in a matrix form, a light shielding layer placed on the semiconductor substrate and having openings (entrances) at the positions corresponding to the light receiving elements, and microlenses located above the light shielding layer. Light rays from an imaging optical system are converged by the microlenses and transmitted through the openings to the light receiving elements.

In these days, the solid state imaging devices are becoming even smaller yet hold more pixels, and the openings are getting smaller in dimension accordingly. As a result, it is becoming difficult to focus light rays toward the light receiving elements strictly by the conventional microlenses. Therefore, solid state imaging devices with an improvement in focusing efficiency are disclosed in Japanese patent No. 2558389, U.S. Pat. No. 6,252,219 (corresponding to Japanese patent laid-open publication No. 11-297974), and U.S. Pat. No. 6,259,083 (corresponding to Japanese patent laid-open publication No. 11-068074).

The solid state imaging devices of the Japanese patent No. 2558389 and the U.S. Pat. No. 6,252,219 both have a concave microlens-forming layer above photoelectric conversion elements (i.e., light receiving elements), and a convex microlens-forming layer above the concave microlens-forming layer. Such a configuration improves the focusing efficiency, compared with the conventional counterparts which only have the convex microlens-forming layer.

In addition, the solid state imaging device of the U.S. Pat. No. 6,252,219 incorporates a concave microlens-forming layer whose concave microlenses have a maximum inclination angle approximately identical to the critical angle for total internal reflection. Thereby, the light rays coming from the convex microlens do not exceed the critical angle for total internal reflection almost anywhere on the concave microlens, and the total internal reflection does not occur in the incident light rays from the convex microlens-forming layer at the concave microlenses. Accordingly, almost all of the incident light rays will pass through the concave microlens-forming layer.

The solid state imaging device of the U.S. Pat. No. 6,259,083 has, at a bottom of a concave lens surface, a well-shaped dug structure which extends toward the light receiving element. This well-shaped dug structure directs incident light rays to the light receiving element.

However, even these solid state imaging devices hardly provide a sufficient efficiency for focusing light rays toward the light receiving element. Especially in these days when the openings are occasionally as small as 1 µm in dimension, it is difficult to focus incident light rays into such small openings.

In addition, while its concave and convex microlens-forming layers can narrow the beams of the vertical incident light to a diameter smaller than the openings, the solid state imaging device of the U.S. Pat. No. 6,252,219 hardly narrow the beams of the oblique incident light to the size of the openings.

Furthermore, in the solid state imaging device of the U.S. Pat. No. 6,259,083, the concave lens surface itself provides little focusing power because a part of it is formed into the well-shaped dug structure. The light rays not focused by the concave lens surface may diffuse when they exit the dug structure, and the focusing efficiency is degraded as a result.

SUMMARY OF THE INVENTION

In view of the foregoing, an object of the present invention is to provide a solid state imaging device which can direct incident light rays from a concave microlens layer to light receiving elements effectively.

In order to achieve the above and other objects, the solid state imaging device according to the present invention includes a semiconductor substrate with a plurality of light receiving elements formed thereon, a light shielding layer which covers an upper surface of the semiconductor substrate, a concave microlens-forming layer which covers upper surfaces of the light receiving elements and the light shielding layer, and a convex microlens-forming layer located above the concave microlens-forming layer. The light shielding layer has a plurality of openings at the positions corresponding to the light receiving elements. An upper surface of the concave microlens-forming layer has concave lens surfaces that lie at positions corresponding to the light receiving elements. An upper surface of the convex microlens-forming layer has convex lens surfaces that also lie at the positions corresponding to the light receiving elements. Each of the concave lens surfaces is composed of an incidence surface lying in the lowermost part and a reflecting surface extending upwards from the rim of the incidence surface. The reflecting surface totally reflects the light rays coming from the convex microlens-forming layer toward the incident surface. The incidence surface focuses the light rays toward the light receiving element.

The solid state imaging device according to the present invention further includes an intermediate layer which covers the upper surface of the concave microlens-forming layer. Additionally, the convex microlens-forming layer is configured such that a focal point of each convex lens surface is located on or above the concave lens surface, or located below the concave lens surface. When the focal point is located on or above the concave lens surface, the reflecting surfaces satisfy the formula "$N_2 \cdot \sin(\theta - \phi) > N_1$" wherein $\theta$ represents an inclination angle of the reflecting surface with respect to a plane parallel to the semiconductor substrate, $N_1$ represents a refractive index of the concave microlens-forming layer, $N_2$ represents a refractive index of the intermediate layer, and $\phi$ represents an inclination angle of a light ray coming from the convex microlens-forming layer with respect to a normal of (i.e., vertical direction to) the semiconductor substrate.

When the focal point is below the concave lens surface, on the other hand, the reflecting surfaces satisfy the formula "$N_2 \cdot \sin(\theta + \phi) > N_1$" wherein $\theta$ represents the inclination angle of the reflecting surface with respect to a plane parallel to the semiconductor substrate's surface, $N_1$ represents the refractive index of the concave microlens-forming layer, $N_2$ represents the refractive index of the intermediate layer, and $\phi$ represents the inclination angle of a light ray coming from the convex microlens-forming layer with respect to the normal of the semiconductor substrate.

Preferably, each concave lens surface has a rim diameter larger than a diameter of a light beam narrowed by the convex lens surface. It is preferable that the incidence surface of each concave lens surface has a radius of curvature smaller than an interior diameter of the openings in the light shielding layer. It is also preferable that an interval between the bottom of the incidence surface and the light receiving element is smaller than a concave lens surface's focal distance dependant on the radius of curvature of the incidence surface.

According to the solid state imaging device of the present invention, the light rays coming from the convex microlens-forming layer enter either the incident surface or the reflecting surface of the concave lens surface. The light rays on the incident surface are focused toward the light receiving elements on the semiconductor substrate. Other light rays totally reflect off the reflecting surface and proceed to the incident surface. Accordingly, the light rays incident to the concave microlens-forming layer are focused with a high degree of accuracy and received by the light receiving elements efficiently.

Since the reflecting surface of the concave lens surface is formed according to the focal point of the convex lens surface, the light rays incident to the concave lens surface are surely received by the light receiving elements.

The focusing efficiency can be more improved either by the concave lens surface whose rim diameter is set smaller than a diameter of a light beam narrowed by the convex lens surface, by the incidence surface whose radius of curvature is set smaller than the interior diameter of the openings in the light shielding layer, and by the interval between the bottom of the incidence surface and the light receiving element defined smaller than the concave lens surface's focal distance dependant on the radius of curvature of the incidence surface.

BRIEF DESCRIPTION OF THE DRAWINGS

The above objects and advantages of the present invention will become more apparent from the following detailed description when read in connection with the accompanying drawings, in which.

DETAILED DESCRIPTION OF THE PREFERRED EMBODIMENTS

Figure 1:
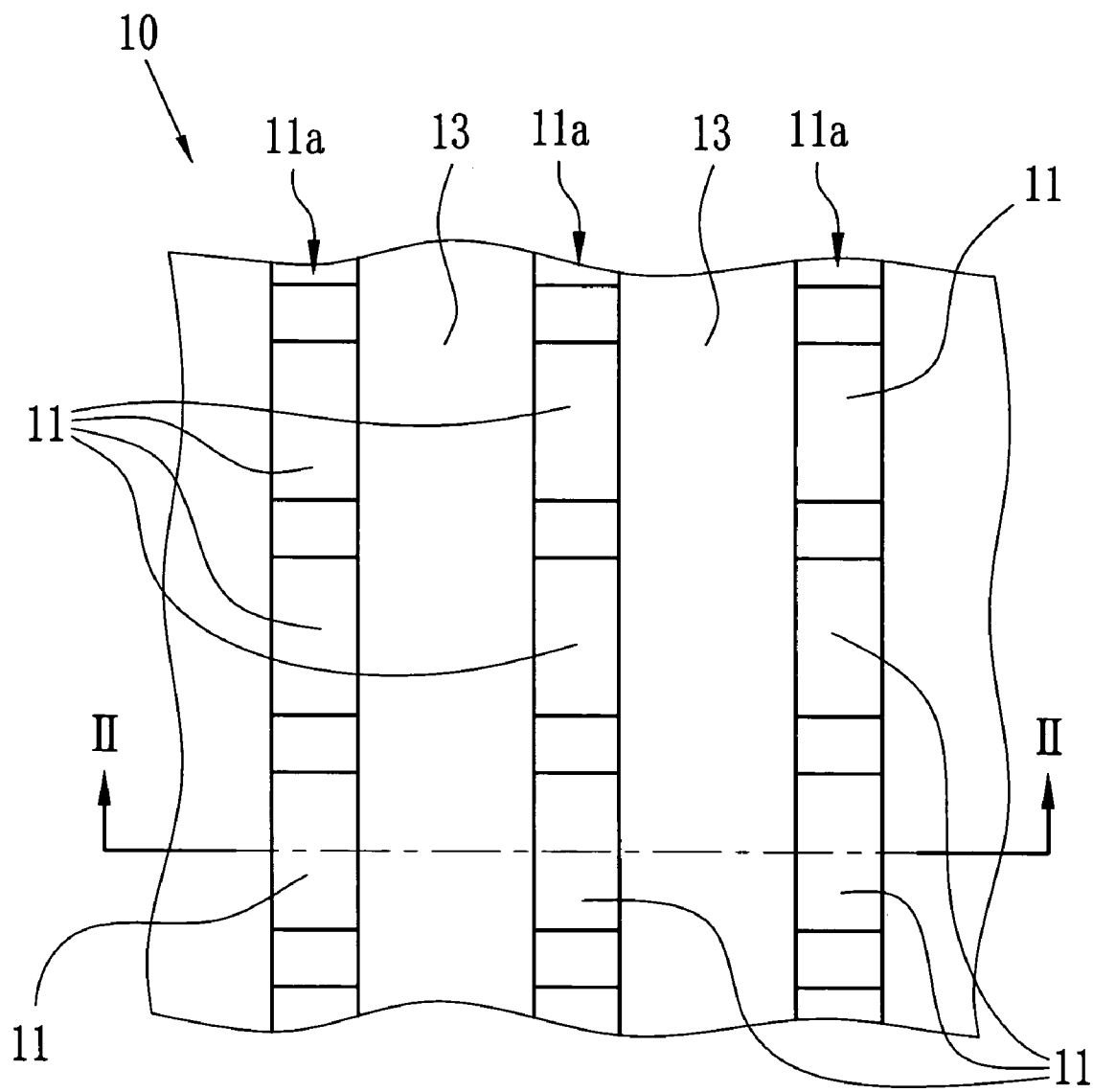
FIG. 1 is an explanatory view of a solid state imaging device according to a first embodiment of the present invention.

Referring to FIG. 1, a solid state imaging device such as, for example, a CCD 10 has a plurality of photodiode arrays 11a that extend in a vertical transfer direction VT. Each photodiode array 11a includes a plurality of photodiodes (light receiving elements) 11 arranged at regular intervals. Formed next to the photodiode arrays 11a are vertical transfer paths 13 that also extend in the vertical transfer direction VT. It is to be noted that an upper structure, such as a light shielding layer, is not illustrated in FIG. 1.

Figure 2:
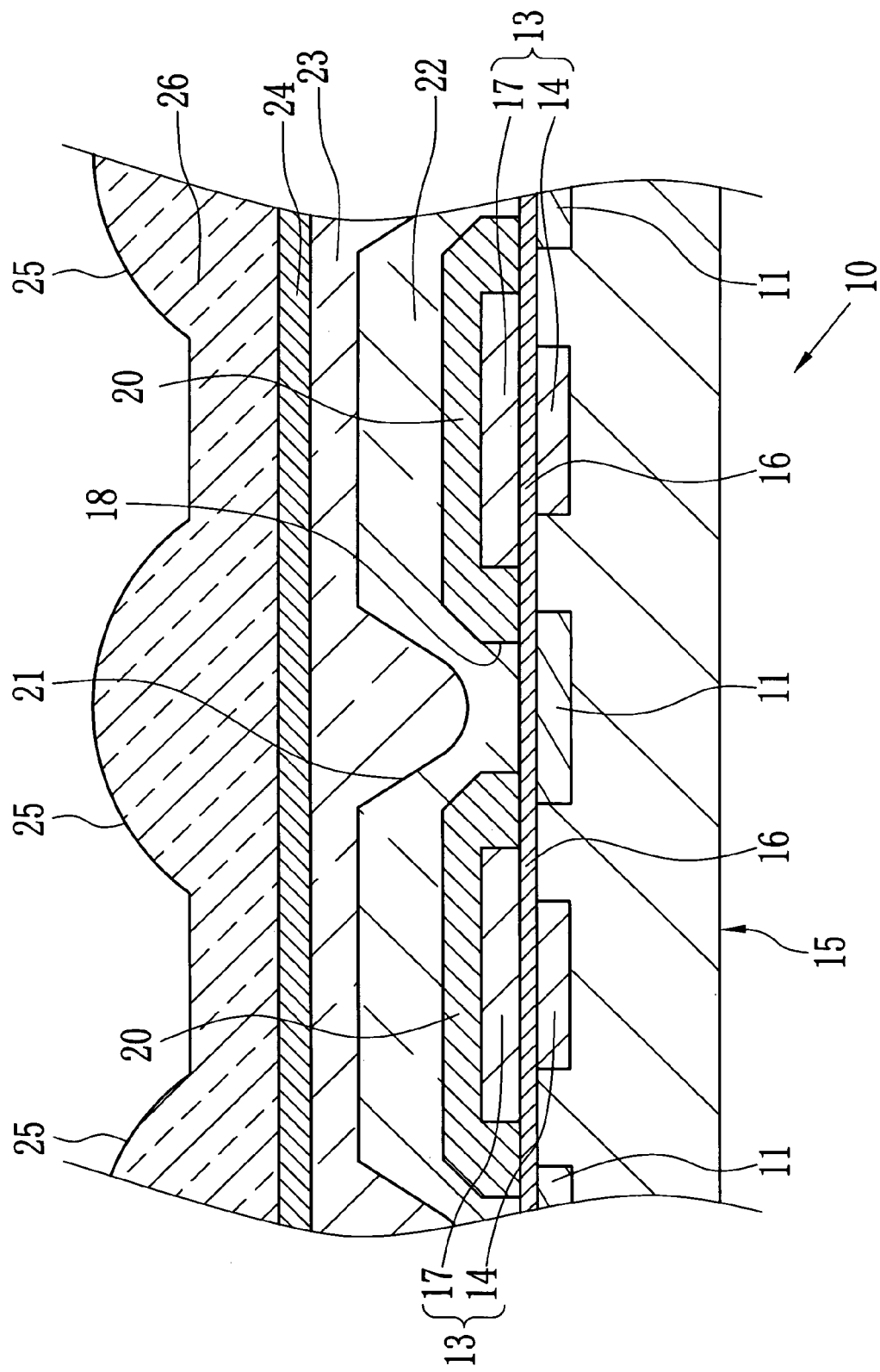
FIG. 2 is a cross sectional view along a line II-II of FIG. 1.

As shown in FIG. 2, the CCD 10 has a semiconductor substrate 15 on which the photodiode arrays 11a and charge transfer sections 14 are formed one after the other. Above the charge transfer sections 14 across an insulating layer 16, transfer electrodes 17 are formed. The charge transfer section 14 and the transfer electrode 17 constitute the vertical transfer paths 13 shown in FIG. 1, and vertically transfer electric charges accumulated in the photodiodes 11. The transfer electrodes 17 are made from, for example, polysilicon by a dry etching method. The insulating layer 16 is made from, for example, $SiO_2$ by a thermal oxidation method or a CVD (Chemical Vapor Deposition) method.

Across the insulating layer 16, the semiconductor substrate 15 is covered by a light shielding layer 20 which is made of a metal, such as aluminum, by a sputtering method or the like. The light shielding layer 20, equipped with openings (entrances) 18 formed therein at the positions corresponding to the photodiodes 11, protects the transfer electrodes 17 from light while it uncovers a top surface of each photodiode 11. Stacked on the light shielding layer 20 and some parts of the insulating layer 16 are, from the bottom to the top, a concave microlens-forming layer 22 which covers both the light shielding layer 20 and the openings 18 and provides concave lens surfaces 21 above the openings 18, a planarizing layer (intermediate layer) 23 which covers the concave microlens-forming layer 22, a color filter 24, and a convex microlens-forming layer 26 providing convex lens surfaces 25 above the concave lens surfaces 21. The concave microlens-forming layer 22 is made of, for example, BPSG (Boron Phosphorous Silicon Glass; refractive index $N_1$=1.4 to 1.5), and the planarizing layer 23 is made of, for example, SiN (Silicon Nitride; refractive index $N_2$=1.9 to 2.0). The color filter 24 is made of a resist material that contains pigments of three colors (R, G, and B) or four colors (R, G, B, and neutral color), and these colors are arranged in a mosaic.

The convex microlens-forming layer 26 has the convex lens surfaces 25 on its upper surface. The concave microlens-forming layer 22 has concave lens surfaces 21 on its upper surface.

Figure 3:
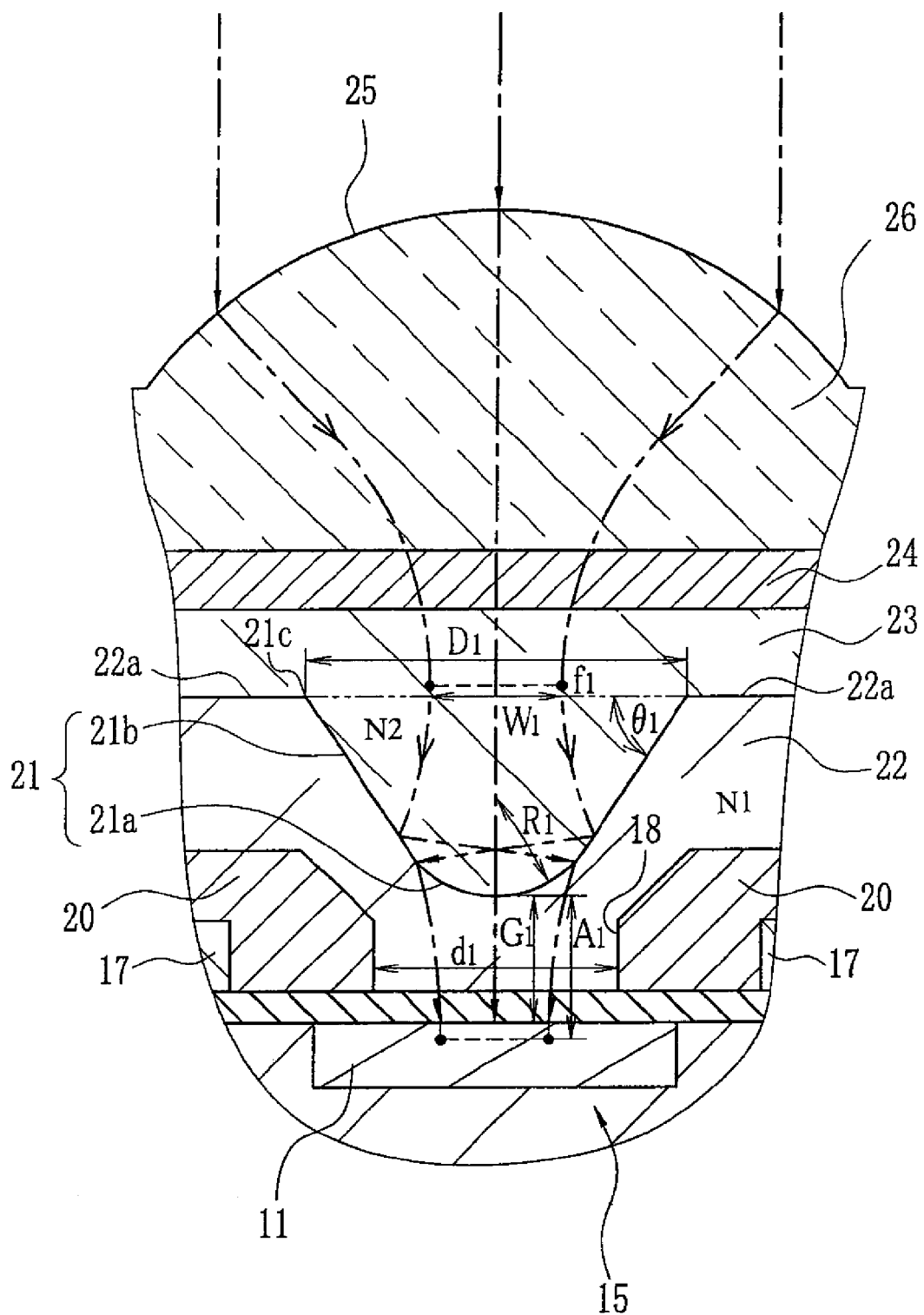
FIG. 3 is an enlarged cross sectional view around a concave lens surface.

As shown in FIG. 3, the convex lens surface 25 has a focal point $f_1$ located above the concave lens surface 21. It is to be noted that, however, the focal point $f_1$ is not limited to this location but may be located at the same level as an entrance 21c of the concave lens surface 21 or located below the entrance 21c. It is also to be noted that aberration occurs in the convex lens surface 25, and the focal point thereof fluctuates depending on a position and a direction of an incident light ray. Accordingly, the focal point is given a diameter, instead of being a single point, dependant on a radius of curvature of the convex lens surface 25.

Each concave lens surface 21 of the concave microlens-forming layer 22 is composed of an arc-shaped incident surface 21a lying in the lowermost part and a reflecting surface 21b extending upwards from the incidence surface 21a. The reflecting surface 21b reflects incident light rays totally and redirects them to the incident surface 21a. A structural condition required to the reflecting surface 21b is now explained with reference to FIG. 4.

Figure 4:
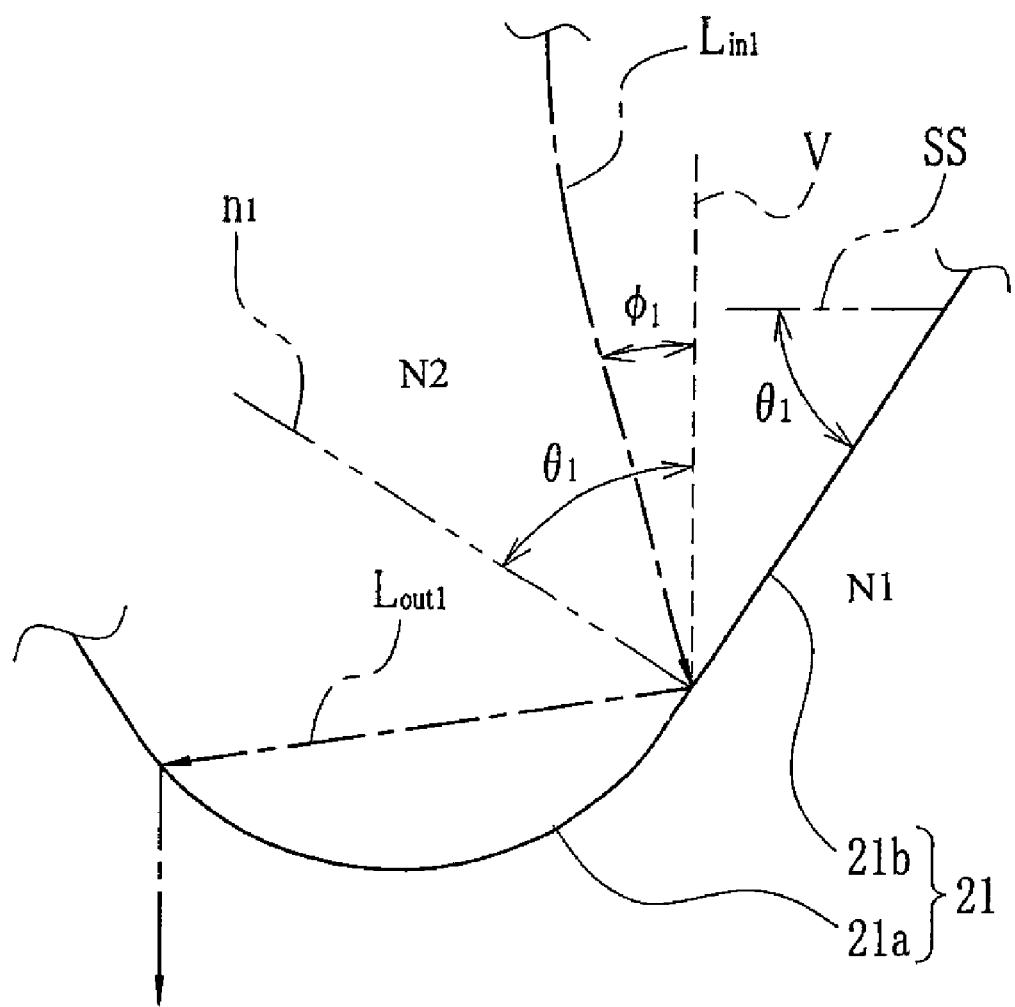
FIG. 4 is an explanatory view showing a relationship of an incident light ray and a reflected light ray on a reflecting surface.

In FIG. 4, the reflecting surface 21b is of approximately cone shape, its generator has an inclination angle $\theta_1$ with respect to a parallel plane SS to the semiconductor substrate 15. As described above, the focal point $f_1$ of the convex lens surface 25 is located above the concave lens surface 21, and thus a light ray that passed through the focal point $f_1$ diffuses outwards and enters the concave lens surface 21. This incident light ray $L_{in1}$ to the concave lens surface 21 has an inclination angle $\phi_1$ with respect to a vertical line V to the semiconductor substrate 15. Accordingly, an angle between the incident light ray $L_{in1}$ and a normal $n_1$ (a line perpendicular to the generator) of the reflecting surface 21b is expressed as $(\theta_1-\phi_1)$. Total internal reflection of the incident light ray $L_{in1}$ occurs when a following formula 1 is satisfied, wherein $N_1$ represents a refractive index of the concave microlens-forming layer 22, and $N_2$ represents a refractive index of the planarizing layer 23.

$$N_2 \cdot \sin(\theta_1-\phi_1) > N_1 \qquad \text{Formula 1}$$

The reflecting surface 21b is configured to satisfy this formula 1.

The incident light ray $L_{in1}$ totally reflects off the reflecting surface 21b to become a reflected light ray $L_{out1}$, and enters the incident surface 21a. In this embodiment, the incident surface 21a is spherical, whose radius of curvature $R_1$ is smaller than an interior diameter $d_1$ of the opening 18 of the light shielding layer 20. Owing to this configuration, the reflected light ray $L_{out1}$ is surely directed to the incident surface 21a, where a beam of the reflected light ray $L_{out1}$ converges. Afterwards, the reflected light ray $L_{out1}$ passes through the concave microlens-forming layer 22 and comes into the photodiode 11.

In addition, as shown in FIG. 3, the entrance 21c of the concave lens surface 21 has a diameter $D_1$ larger than a narrowed diameter $W_1$ of an incident light ray coming from the convex lens surface 25. Accordingly, the light ray from the convex lens surface 25 enters the incident surface 21a directly, or reflects off the reflecting surface 21b and proceeds to the incident surface 21a. Then, the light ray enters the concave microlens-forming layer 22 and comes into the photodiode 11.

On top of that, a bottom of the incident surface 21a is spaced from the photodiode 11 by an interval $G_1$. The interval $G_1$ is smaller than a focal distance $A_1$ of the concave lens surface 21 dependant on the radius of curvature $R_1$ of the incident surface 21a. For better focus of light rays toward the photodiodes 11, the radius of curvature $R_1$ should be small enough. Since the focal distance $A_1$ becomes shorter as the radius of curvature $R_1$ decreases, however, the small radius of curvature $R_1$ allows the light rays out of the incident surface 21a to diffuse rapidly. Accordingly, the interval $G_1$ is made smaller than the focal distance $A_1$ as described above, and this prevents the diffusion of the light rays in the concave microlens-forming layer 22.

Next, an optical function of the microlens-forming layers is described. Having passed through the convex lens surface 25, the incident light ray $L_{in1}$ totally reflects off the reflecting surface 21b and becomes the reflected light ray $L_{out1}$ to proceed to the incident surface 21a. The reflected light ray $L_{out1}$ is then focused by the incident surface 21a and received by the photodiode 11. In this manner, the incident light rays are focused toward the photodiodes 11 effectively, and the sensitivity of the CCD 10 is improved. Additionally, the entrance 21c of the concave lens surface 21 has the diameter $D_1$ larger than the narrowed diameter $W_1$ of the incident light ray at the entrance 21c, and this ensures that all the incident light rays from the convex lens surface 25 enter the concave lens surface 21. Therefore, the focusing efficiency is further improved. Since the incident surface 21a has the radius of curvature $R_1$ smaller than the interior diameter $d_1$ of the opening 18, the beam of the incident light ray is narrowed effectively and received by the photodiode 11. Furthermore, the interval $G_1$ between the bottom of the incident surface 21a and the photodiode 11 is made smaller than the focal distance $A_1$ of the concave lens surface 21 dependant on the radius of curvature $R_1$ of the incident surface 21a, and this also improves the focusing efficiency.

Figure 5:
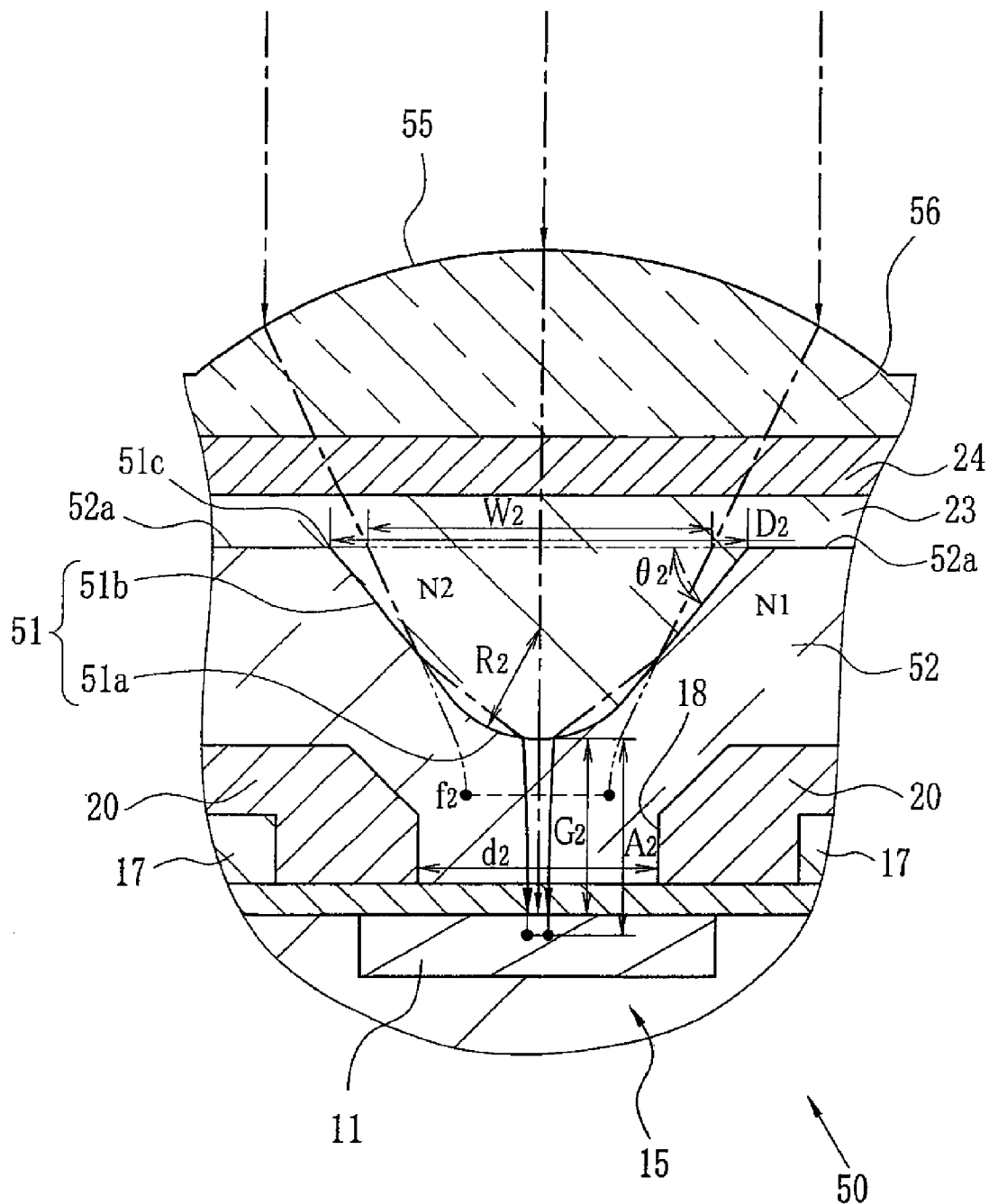
FIG. 5 is an enlarged cross sectional view around a concave lens surface of a solid state imaging device according to a second embodiment of the present invention, wherein a focal point of a convex lens surface is located below the concave lens surface.

Although, in the above embodiment, the focal point of the convex lens surface is located above the concave lens surface, the focal point may be located below the concave lens surface. A second embodiment of the present invention is shown in FIG. 5. It is to be noted that the same components as those of the first embodiment are denoted by the same reference numerals, and the detailed explanations thereof are omitted. As shown in FIG. 5, a CCD 50 includes a concave microlens-forming layer 52 having concave lens surfaces 51 formed therein, and a convex microlens-forming layer 56 having convex lens surfaces 55 formed therein. Each of the convex lens surfaces 55 has a focal point $f_2$ located below the concave lens surface 51.

Each concave lens surface 51 is composed of an arc-shaped incident surface 51a and a reflecting surface 51b extending from the incidence surface 51a. The reflecting surface 51b reflects incident light rays from the convex lens surface 55 totally and redirects them to the incident surface 51a. A structural condition required to the reflecting surface 51b is now explained with reference to FIG. 6.

Figure 6:
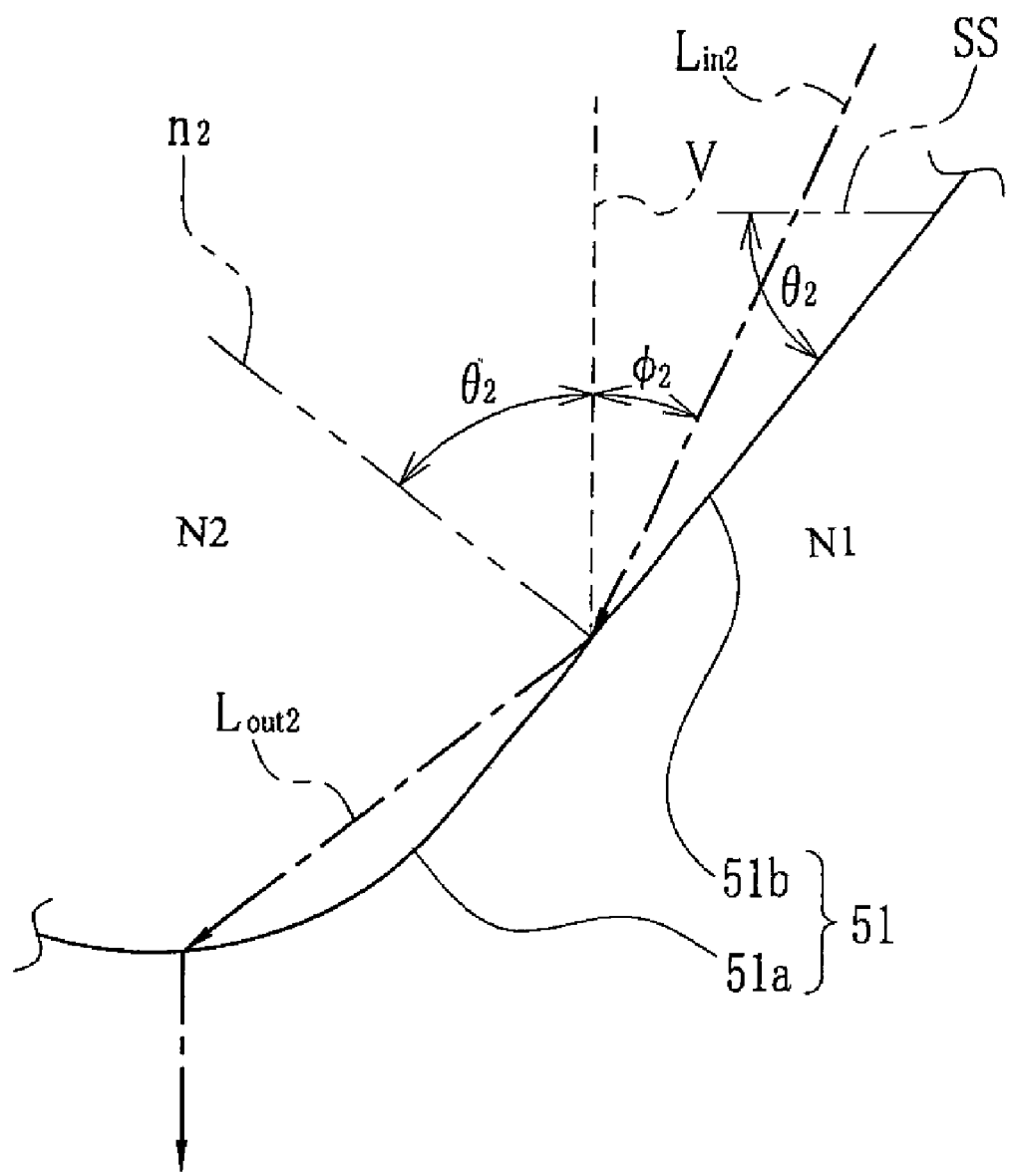
FIG. 6 is an explanatory view showing a relationship of an incident light ray and a reflected light ray on a reflecting surface of the second embodiment.

In FIG. 6, a generator of the reflecting surface 51b has an inclination angle $\theta_2$ with respect to a parallel plane SS to the semiconductor substrate 15. Since the focal point $f_2$ of the convex lens surface 55 is located below the concave lens surface 51 as described above, an incident light ray $L_{in2}$ coming from the convex lens surface 55 converges toward the focal point $f_2$ and enters the concave lens surface 51. This incident light ray $L_{in2}$ has an inclination angle $\phi_2$ with respect to a vertical line V to the semiconductor substrate 15. Accordingly, an angle between the incident light ray $L_{in2}$ and a normal $n_2$ (a line perpendicular to the generator) of the reflecting surface 51b is expressed as $(\theta_2+\phi_2)$. Total internal reflection of the incident light ray $L_{in2}$ occurs when a formula 2 is satisfied, wherein $N_1$ represents a refractive index of the concave microlens-forming layer 52, and $N_2$ represents a refractive index of the planarizing layer 23.

$$N_2 \cdot \sin(\theta_2+\phi_2) > N_1 \qquad \text{Formula 2}$$

The reflecting surface 51b is configured to satisfy this formula 2. In addition, as shown in FIG. 5, the incident surface 51a is spherical, whose radius of curvature $R_2$ is smaller than the interior diameter $d_1$ of the opening 18 of the light shielding layer 20. Owing to this configuration, the incident light ray $L_{in1}$ totally reflects off the reflecting surface 51b and becomes a reflected light ray $L_{out2}$ to enter the incident surface 51a. The reflected light ray $L_{out2}$ is then narrowed by the incident surface 51a, and passes through the concave microlens-forming layer 52 to come into the photodiode 11. Namely, this embodiment can provide the same effect as the first embodiment.

The concave lens surface 51 has an entrance 51c whose diameter $D_2$ is larger than a narrowed diameter $W_2$ of a light ray coming from the convex lens surface 55. Additionally, a bottom of the incident surface 51a is spaced from the photodiode 11 by an interval $G_2$. The interval $G_2$ is smaller than a focal distance $A_2$ of the concave lens surface 51 dependant on the radius of curvature $R_2$ of the incident surface 51a. These configurations ensure that the light ray which passed through the incident surface 51a comes into the photodiode 11 without diffusing in the concave microlens-forming layer 52.

Accordingly, the focusing efficiency is improved as effectively as the first embodiment.

EXAMPLE 1

Figure 7:
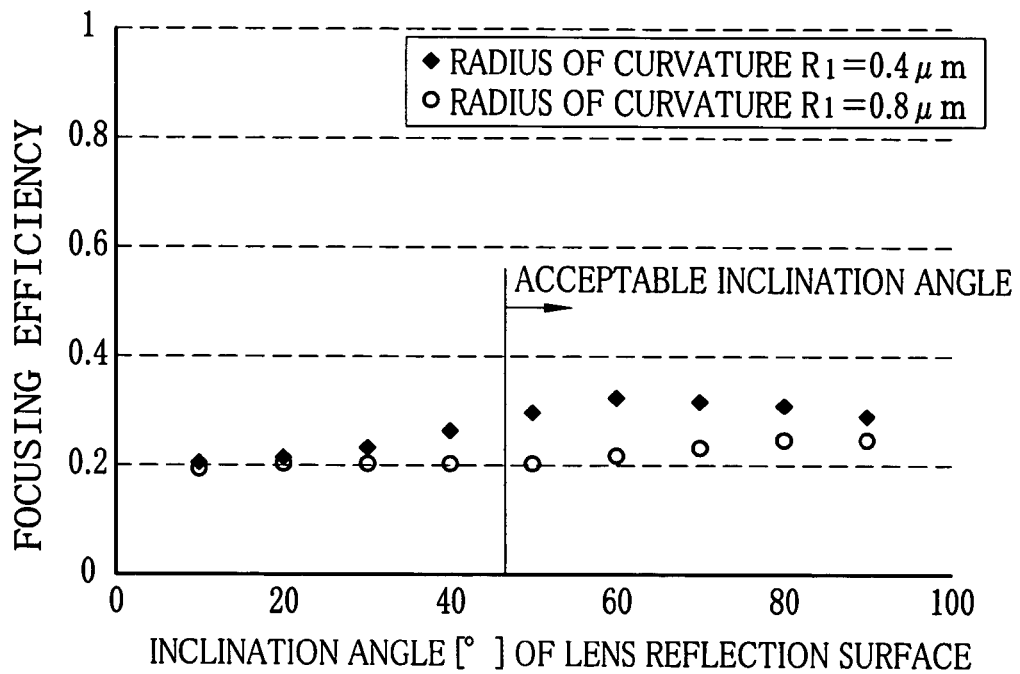
FIG. 7 is a graph showing a result of a focusing efficiency measurement on a first CCD example.

Next, a CCD example 1 is prepared according to the first embodiment, and its focusing efficiency is measured at various inclination angles $\theta_1$ of the reflecting surface 21b. In the example 1, the focal point $f_1$ is located at the same level as the entrance 21c of the concave lens surface 21, and the interior diameter $d_1$ of the opening 18 of the light shielding layer 20 is 0.4 μm. Combinations of the inclination angle $\theta_1$ of the reflecting surface 21b and the radius of curvature $R_1$ of the incident surface 21a are listed in Table 1 below. A result of the measurement is shown in FIG. 7. It is noted that the inclination angle $\theta_1$ of the reflecting surface 21b should be no less than 47° for the example 1 to satisfy the formula 1.

TABLE 1

| | RADIUS OF CURVATURE | |
|---|---|---|
| | 0.4 μm | 0.8 μm |
| INCLINATION ANGLE [°] | 10 | 10 |
| | 20 | 20 |
| | 30 | 30 |
| | 40 | 40 |
| | 50 | 50 |
| | 60 | 60 |
| | 70 | 70 |
| | 80 | 80 |
| | 90 | 90 |

As shown in a graph of FIG. 7, good focusing efficiency was achieved as long as the inclination angle $\theta_1$ satisfied the formula 1. Especially with the inclination angle $\theta_1$ at 60°, the focusing efficiency was most improved. It should be noted that the 0.8 μm radius of curvature $R_1$ provided less focusing efficiency than the 0.4 μm radius of curvature $R_1$. This is because the radius of curvature $R_1$ became larger than the interior diameter $d_1$ of the opening 18, and the beam of the light ray was not narrowed sufficiently.

EXAMPLE 2

Figure 8:
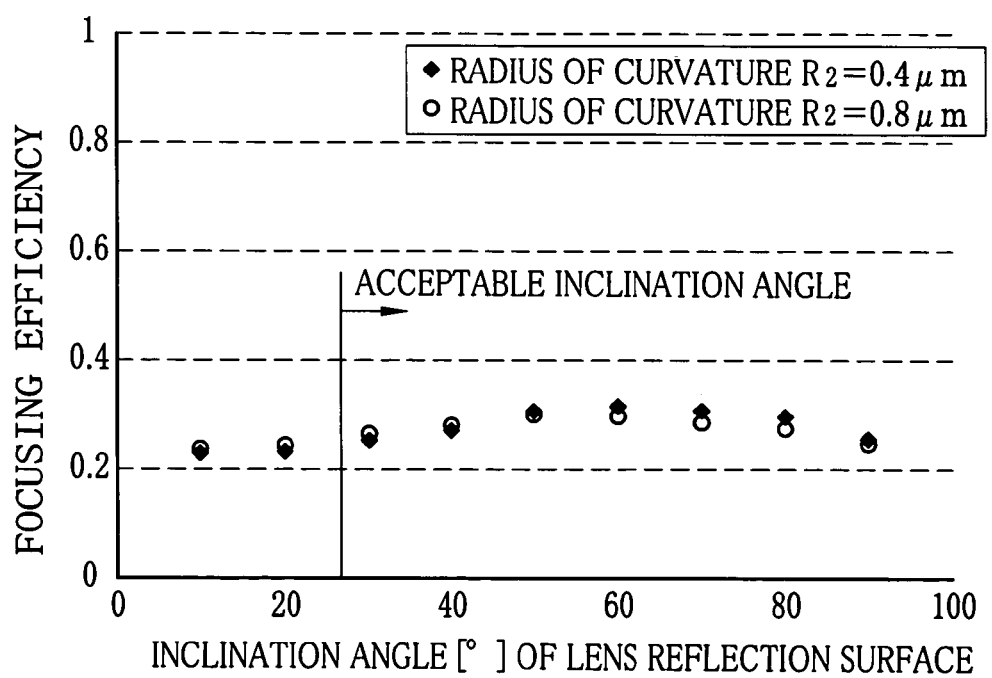
FIG. 8 is a graph showing a result of the focusing efficiency measurement on a second CCD example.

Next, a CCD example 2 is prepared according to the second embodiment, and its focusing efficiency is measured at various inclination angles $\theta_2$ of the reflecting surface 51b. In the example 2, the focal point $f_2$ is located at the same level as the photodiode 11, and the interior diameter $d_2$ of the opening 18 of the light shielding layer 20 is 0.4 μm. Combinations of the inclination angle $\theta_2$ of the reflecting surface 51b and the radius of curvature $R_2$ of the incident surface 51a are the same as listed in Table 1 above. A result of the measurement is shown in FIG. 8. It is to be noted that the inclination angle $\theta_2$ of the reflecting surface 51b should be no less than 27° for the example 2 to satisfy the formula 2.

As shown in a graph of FIG. 8, good focusing efficiency was achieved as long as the inclination angle $\theta_2$ satisfied the formula 2. Especially with the inclination angle $\theta_2$ at 60°, the focusing efficiency was most improved. It should be noted that the 0.8 μm radius of curvature $R_2$ provided less focusing efficiency than the 0.4 μm radius of curvature $R_2$. This is because the radius of curvature $R_2$ became larger than the interior diameter $d_2$ of the opening 18, and the beam of the light ray was not narrowed sufficiently.

Although the present invention has been fully described by the way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. A solid state imaging device including a semiconductor substrate with a plurality of light receiving elements formed thereon, a light shielding layer for covering an upper surface of said semiconductor substrate and having openings formed at positions corresponding to said light receiving elements, a concave microlens-forming layer for covering upper surfaces of both said light shielding layer and said light receiving elements and having cone-shaped concave lens surfaces formed at positions corresponding to said light receiving elements, and a convex microlens-forming layer located above said concave microlens-forming layer and having convex lens surfaces formed at positions corresponding to said light receiving elements, said concave lens surface comprising:

an incident surface lying at the lowermost part of said concave lens surface and for focusing light rays toward said light receiving element; and a reflecting surface extending upwards from a rim of said incident surface and for totally reflecting light rays coming from said convex lens surface toward said incident surface, wherein said incident surface focuses said totally reflected light rays toward said light receiving element.

2. The solid state imaging device described in claim 1, further comprising:

an intermediate layer for covering an upper surface of said concave microlens-forming layer, wherein a focal point of said convex lens surface is located on or above said concave lens surface, and wherein said reflecting surface satisfies a formula expressed as follows:

$$N_2 \cdot \sin(\theta_1 - \phi_1) > N_1$$

where $\theta_1$ being an inclination angle of said reflecting surface with respect to a plane parallel to said semiconductor substrate, $N_1$ being a refractive index of said concave microlens-forming layer, $N_2$ being a refractive index of said intermediate layer, and $\phi_1$ being an inclination angle of an incident light ray coming from said convex lens surface with respect to a vertical direction to said semiconductor substrate.

3. The solid state imaging device described in claim 2, wherein the inclination angle θ is no less than 47°.

4. The solid state imaging device described in claim 2, wherein the inclination angle θ is substantially 60°.

5. The solid state imaging device described in claim 1, further comprising:

an intermediate layer for covering an upper surface of said concave microlens-forming layer, wherein a focal point of said convex lens surface is located below said concave lens surface, and wherein said reflecting surface satisfies a formula expressed as follows:

$$N_2 \cdot \sin(\theta_2 + \phi_2) > N_1$$

where $\theta_2$ being an inclination angle of said reflecting surface with respect to a parallel plane to said semiconductor substrate, $N_1$ being a refractive index of said concave microlens-forming layer, $N_2$ being a refractive index of said intermediate layer, and $\phi_2$ being an inclination angle of an incident light ray coming from said convex lens surface with respect to a vertical direction to said semiconductor substrate.

6. The solid state imaging device described in claim 5, wherein the inclination angle θ is no less than 27°.

7. The solid state imaging device described in claim 5, wherein the inclination angle θ is substantially 60°.

8. The solid state imaging device described in claim 1, wherein said concave lens surface has a diameter larger than a diameter of a light beam narrowed by said convex lens surface.

9. The solid state imaging device described in claim 1, wherein said incident surface is substantially spherical and has a radius of curvature smaller than an interior diameter of said openings.

10. The solid state imaging device described in claim 9, wherein an interval between a bottom of said incident surface closet to said light receiving element, and said light receiving element is smaller than a focal distance of said concave lens surface dependant on said radius of curvature of said incident surface.

11. The solid state imaging device described in claim 1, wherein the convex lens surface has a focal point located at the same level as an entrance of the concave lens surface or located below the entrance of the concave lens surface.

12. The solid state imaging device described in claim 1, wherein the incident surface is an arc-shaped surface.

13. The solid state imaging device described in claim 1, wherein said incident surface is spherical.

14. The solid state imaging device described in claim 1, wherein an interval between a bottom of said incident surface and said light receiving element is smaller than a focal distance of said concave lens surface, to prevent diffusion of light rays in said concave microlens-forming layer.

15. The solid state imaging device described in claim 1, wherein a light ray from said convex lens surface enters said incident surface directly, or reflects off said reflecting surface and proceeds to said incident surface, and, afterwards, the light ray enters said concave microlens-forming layer and comes into said light receiving element.

16. The solid state imaging device described in claim 1, wherein an interval between a bottom of said incident surface and said light receiving element and a focal distance of said concave lens surface are set such that diffusion of light rays in said concave microlens-forming layer is prevented.

17. The solid state imaging device described in claim 1, wherein incident light rays from said convex lens surface enter said concave lens surface.

18. The solid state imaging device described in claim 1, wherein a beam of incident light rays is narrowed by said concave lens surface and is received by one of said light receiving elements.

19. The solid state imaging device described in claim 1, further comprising an intermediate layer covering said concave microlens-forming layer, wherein said concave microlens-forming layer is made of Boron Phosphorous Silicon Glass, and said intermediate layer is made of Silicon Nitride.

20. The solid state imaging device described in claim 1, wherein said concave microlens-forming layer has said concave lens surfaces on an upper surface.

* * * * *